(12) United States Patent
Henmi et al.

(10) Patent No.: US 7,452,744 B2
(45) Date of Patent: Nov. 18, 2008

(54) METHOD OF MANUFACTURING SOLID IMAGE PICKUP APPARATUS

(75) Inventors: Ken Henmi, Takatsuki (JP); Toshihiro Kuriyama, Otsu (JP)

(73) Assignee: Panasonic Corporation, Osaka (JP)

( * ) Notice: Subject to any disclaimer, the term of this patent is extended or adjusted under 35 U.S.C. 154(b) by 259 days.

(21) Appl. No.: 11/302,191

(22) Filed: Dec. 14, 2005

(65) Prior Publication Data

US 2006/0134807 A1   Jun. 22, 2006

(30) Foreign Application Priority Data

Dec. 22, 2004   (JP) .............................. 2004-370607

(51) Int. Cl.
*H01L 21/00* (2006.01)
(52) U.S. Cl. ........................ 438/57; 438/573; 438/642; 438/659; 257/E31.076; 257/E31.078
(58) Field of Classification Search .................. 438/57, 438/659, 573, 642; 257/E31.076, E31.078
See application file for complete search history.

(56) References Cited

U.S. PATENT DOCUMENTS

| | | | |
|---|---|---|---|
| 6,028,629 A * | 2/2000 | Shioyama et al. ........... 348/294 |
| 6,274,489 B1 * | 8/2001 | Ono et al. .................... 438/659 |
| 2004/0084715 A1 * | 5/2004 | Takeuchi et al. ............. 257/315 |
| 2004/0253756 A1 * | 12/2004 | Cok et al. ...................... 438/22 |
| 2005/0151228 A1 * | 7/2005 | Tanida et al. ................. 257/620 |
| 2005/0161709 A1 * | 7/2005 | Miwa et al. .................. 257/215 |

FOREIGN PATENT DOCUMENTS

JP          2003-31789        1/2003

* cited by examiner

*Primary Examiner*—Walter L Lindsay, Jr.
*Assistant Examiner*—Abdulfattah Mustapha
(74) *Attorney, Agent, or Firm*—Steptoe & Johnson LLP

(57) ABSTRACT

A first gate electrode and a second gate electrode are formed on a semiconductor substrate, and then a resist pattern is formed so as to selectively leave open a portion including an overlap between the first and second gate electrodes. Next, the overlap between the gate electrodes is removed through isotropic etching. Etching is carried out at this time by an amount within a range of 140% to 200% of the film thickness of the second gate electrode. Next, a normal inter-layer insulating film and light-shielding film are formed. It is possible to eliminate the overlap between the gate electrodes adjacent to an opening of the light-shielding film, suppress the height of the light-shielding film at that portion, reduce shading for the light condensed by a lens and thereby improve the light condensing efficiency of the lens.

14 Claims, 11 Drawing Sheets

F I G. 9 A
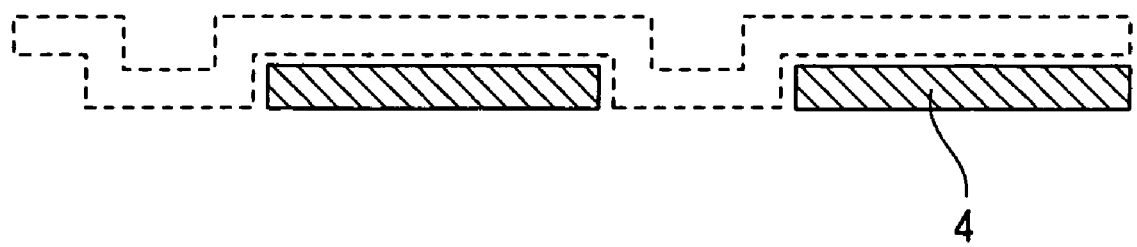
F I G. 9 B
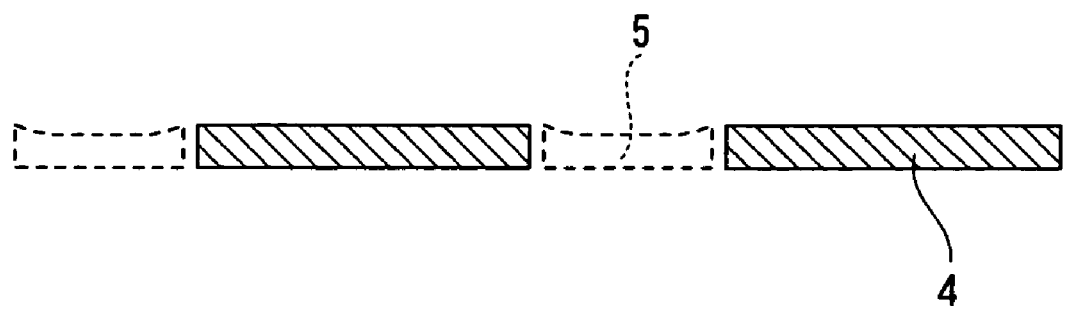
F I G. 9 C
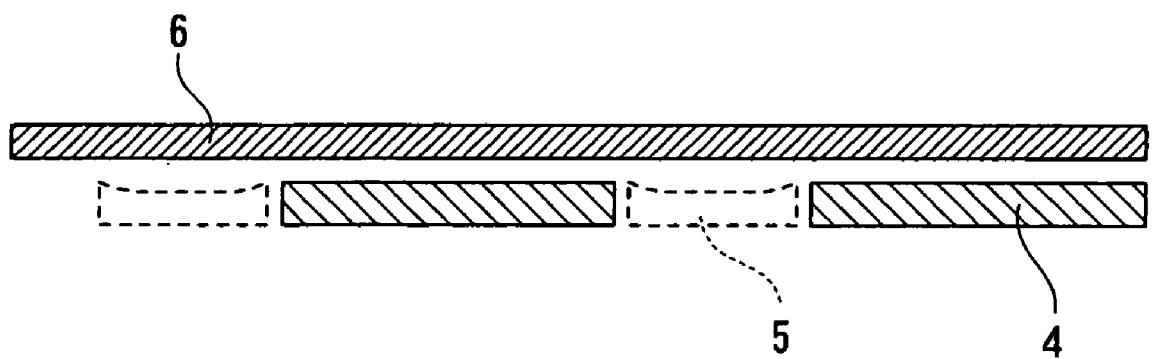

METHOD OF MANUFACTURING SOLID IMAGE PICKUP APPARATUS

FIELD OF THE INVENTION

The present invention relates to a method of manufacturing a solid image pickup apparatus using a solid image pickup element such as CCD (charge-coupled device) as an image pickup element.

BACKGROUND OF THE INVENTION

Conventionally, a CCD type image pickup apparatus using a CCD as its solid image pickup element is widely used as a solid image pickup apparatus using a solid image pickup element.

Hereinafter, a conventional solid image pickup apparatus using a CCD as its solid image pickup element will be explained (see JP2003-31789A).

FIG. 10 is a plan view showing the structure of a conventional solid image pickup apparatus. Furthermore, FIGS. 11A to 11C are cross-sectional views showing the structure of the conventional solid image pickup apparatus; FIG. 11A is an A-A' cross-sectional view of FIG. 10, FIG. 11B is a B-B' cross-sectional view of FIG. 10 and FIG. 11C is a C-C' cross-sectional view of main components of FIG. 10.

In FIG. 10 and FIGS. 11A to 11C, reference numeral 21 denotes a semiconductor substrate, 22, 22a denote diffused layers selectively formed on the surface of the semiconductor substrate 21, 23 denotes an oxide insulating film formed over the entire surface of the semiconductor substrate 21 including the diffused layer 22, 24 denotes a first gate electrode, 25 denotes a second gate electrode, 26 denotes a light-shielding film, 27 denotes transparent resin or color resin and 28 denotes a lens. Note that since the bottom surface of each lens 28 is flattened, variations from one pixel to another are suppressed.

The operation of the solid image pickup apparatus having such a structure will be explained below. Light from an object is condensed by the lens 28, passes through the transparent (or color) resin 27 and only a light component entering a light-receiving area of the diffused layer 22 corresponding to an opening 26a of the light-shielding film 26 is photoelectrically converted. After the photoelectric conversion, the signal charge moves to a transfer area by applying a voltage to a second gate electrode 25. After the signal charge is moved to the transfer area, the signal charge is sequentially transferred through the interior of the transfer area diffused layer 22a by applying a voltage to the adjacent first gate electrode 24 and then further applying a sequential voltage to the adjacent second gate electrode 25, and finally output from this apparatus as an electric signal having a waveform corresponding to an intensity variation of the light from the object.

However, in the above described conventional solid image pickup apparatus, as shown in the A-A' cross-sectional view of FIG. 11A, since the gate electrode is formed in a stack structure with two polysilicon layers of the first gate electrode 24 and the second gate electrode 25, the stack of the two layers of the gate electrodes 24, 25 exists in an area adjacent to the opening 26a of the light-shielding film 26 which constitutes the light-receiving area of the diffused layer 22.

For this reason, the light-shielding film 26 is elevated by an amount corresponding to the film thickness of one layer of the gate electrode in its stacked part, an amount of blocked light condensed by the lens 28, that is, "shading" increases, producing a problem that sensitivity decreases noticeably in finer pixels in particular.

The present invention is intended to solve the above described conventional problem and provides a method of manufacturing a solid image pickup apparatus capable of improving pixel sensitivity by improving the light condensing efficiency of a lens also for finer pixels and stably obtaining high sensitivity pixels.

DISCLOSURE OF THE INVENTION

In order to solve the above described problem, a first method of manufacturing a solid image pickup apparatus of the present invention is a method of manufacturing a solid image pickup apparatus including a plurality of light-receiving areas formed on a semiconductor substrate, moving signal charge obtained by photoelectrically converting light incident upon the light-receiving areas in a transfer area within the semiconductor substrate with a sequential voltage applied to a first electrode and a second electrode formed in the vicinity of the light-receiving areas and finally outputting an electric signal having a waveform varying in accordance with intensity of the incident light, comprising a step of forming an insulating film on the semiconductor substrate, a step of forming the first electrode on the semiconductor substrate via the insulating film, a step of forming the second electrode on the semiconductor substrate with the second electrode electrically insulated from the first electrode and a step of removing part of the portion of the second electrode overlapping with the first electrode, wherein the area of the second electrode overlapping with the first electrode is only the area corresponding to the principal light-receiving area of the transfer area.

Furthermore, a second method of manufacturing a solid image pickup apparatus of the present invention is a method of manufacturing a solid image pickup apparatus including a plurality of light-receiving areas formed on a semiconductor substrate, moving signal charge obtained by photoelectrically converting light incident upon the light-receiving areas in a transfer area within the semiconductor substrate with a sequential voltage applied to a first electrode and a second electrode formed in the vicinity of the light-receiving areas and finally outputting an electric signal having a waveform varying in accordance with intensity of the incident light, comprising a step of forming an insulating film on the semiconductor substrate, a step of forming the first electrode on the semiconductor substrate via the insulating film, a step of forming the second electrode on the semiconductor substrate with the second electrode electrically insulated from the first electrode and a step of removing part of the portion of the second electrode overlapping with the first electrode, wherein in the step of removing part of the portion of the second electrode overlapping with the first electrode, part of the portion of the second electrode overlapping with the first electrode is left open after the second electrode is formed and only the opening area is etched.

The area of the opening is preferably smaller than the area of the portion of the second electrode overlapping with the first electrode.

In the etching of the opening area, a selection ratio between the inter-layer insulating film and the second electrode is preferably 1:100 or higher.

A third method of manufacturing a solid image pickup apparatus of the present invention is a method of manufacturing a solid image pickup apparatus including a plurality of light-receiving areas formed on a semiconductor substrate, moving signal charge obtained by photoelectrically converting light incident upon the light-receiving areas in a transfer area within the semiconductor substrate with a sequential voltage applied to a first electrode and a second electrode formed in the vicinity of the light-receiving areas and finally outputting an electric signal having a waveform varying in accordance with intensity of the incident light, comprising a step of forming an insulating film on the semiconductor substrate, a step of forming the first electrode on the semiconductor substrate via the insulating film, a step of forming the second electrode on the semiconductor substrate with the second electrode electrically insulated from the first electrode and a step of removing part of the portion of the second electrode overlapping with the first electrode, wherein in the step of forming the second electrode on the semiconductor substrate with the second electrode electrically insulated from the first electrode, an inter-layer insulating film is formed between the first electrode and the second electrode.

A fourth method of manufacturing a solid image pickup apparatus of the present invention is a method of manufacturing a solid image pickup apparatus including a plurality of light-receiving areas formed on a semiconductor substrate, moving signal charge obtained by photoelectrically converting light incident upon the light-receiving areas in a transfer area within the semiconductor substrate with a sequential voltage applied to a first electrode and a second electrode formed in the vicinity of the light-receiving areas and finally outputting an electric signal having a waveform varying in accordance with intensity of the incident light, comprising a step of forming an insulating film on the semiconductor substrate, a step of forming the first electrode on the semiconductor substrate via the insulating film, a step of forming the second electrode on the semiconductor substrate with the second electrode electrically insulated from the first electrode and a step of removing all the portion of the second electrode overlapping with the first electrode.

In the step of removing part of the portion of the second electrode overlapping with the first electrode, the portion of the second electrode overlapping with the first electrode is preferably left open after the second electrode is formed and only the opening area is etched.

The area of the portion of the second electrode overlapping with the first electrode is preferably smaller than the area of the opening.

In the step of forming the second electrode on the semiconductor substrate with the second electrode electrically insulated from the first electrode, an inter-layer insulating film is preferably formed between the first electrode and the second electrode.

In the etching of the opening area, the selection ratio between the inter-layer insulating film and the second electrode is preferably 1:100 or higher.

A fifth method of manufacturing a solid image pickup apparatus of the present invention is a method of manufacturing a solid image pickup apparatus including a plurality of light-receiving areas formed on a semiconductor substrate, moving signal charge obtained by photoelectrically converting light incident upon the light-receiving areas in a transfer area within the semiconductor substrate with a sequential voltage applied to a first electrode and a second electrode formed in the vicinity of the light-receiving areas and finally outputting an electric signal having a waveform varying in accordance with intensity of the incident light, comprising a step of forming an insulating film on the semiconductor substrate, a step of forming the first electrode on the semiconductor substrate via the insulating film, a step of forming a film of the second electrode over the entire surface of the semiconductor substrate and a step of removing part of the film of the second electrode and forming the second electrode on the semiconductor substrate with the second electrode electrically insulated from the first electrode.

In the step of removing part of the film of the second electrode, only the portion of the first electrode corresponding to the principal light-receiving area of the transfer area is preferably left open and only the opening area is etched.

The area of the opening is preferably smaller than the area of the portion of the second electrode to be removed.

In the etching of the opening area, the selection ratio between the inter-layer insulating film and the second electrode is preferably 1:100 or higher.

A sixth method of manufacturing a solid image pickup apparatus of the present invention is a method of manufacturing a solid image pickup apparatus including a plurality of light-receiving areas formed on a semiconductor substrate, moving signal charge obtained by photoelectrically converting light incident upon the light-receiving areas in a transfer area within the semiconductor substrate with a sequential voltage applied to a first electrode and a second electrode formed in the vicinity of the light-receiving areas and finally outputting an electric signal having a waveform varying in accordance with intensity of the incident light, comprising a step of forming an embedded gate electrode after a diffused layer is selectively formed on the semiconductor substrate, a step of forming an insulating film on the semiconductor substrate, a step of forming a contact hole in the gate electrode and an oxide insulating film, a step of forming the first electrode on the semiconductor substrate via the insulating film and electrically connecting the first gate electrode and the embedded gate electrode via the contact hole, a step of forming the second electrode on the semiconductor substrate with the second electrode electrically insulated from the first electrode and a step of removing at least part of the second electrode overlapping with the first electrode.

As described above, it is possible to remove the overlap between the gate electrodes adjacent to the opening of the light-shielding film, suppress the height of the light-shielding film at that portion, reduce the shading with respect to the light condensed by the lens and thereby improve the light condensing efficiency of the lens.

Therefore, even with finer pixels, it is possible to improve the light condensing efficiency of the lens, improve pixel sensitivity and realize an image pickup apparatus capable of obtaining stable and high sensitivity pixels.

BRIEF DESCRIPTION OF THE DRAWINGS

FIGS. 9A to 9C show manufacturing steps illustrating a method of manufacturing the solid image pickup apparatus according to Embodiment 4 of the present invention;

DESCRIPTION OF THE EMBODIMENTS

With reference now to the attached drawings, a solid image pickup apparatus and a method of manufacturing the solid image pickup apparatus according to an embodiment of the present invention will be explained below.

Embodiment 1

A solid image pickup apparatus and method of manufacturing the solid image pickup apparatus according to Embodiment 1 will be explained.

Figure 1:
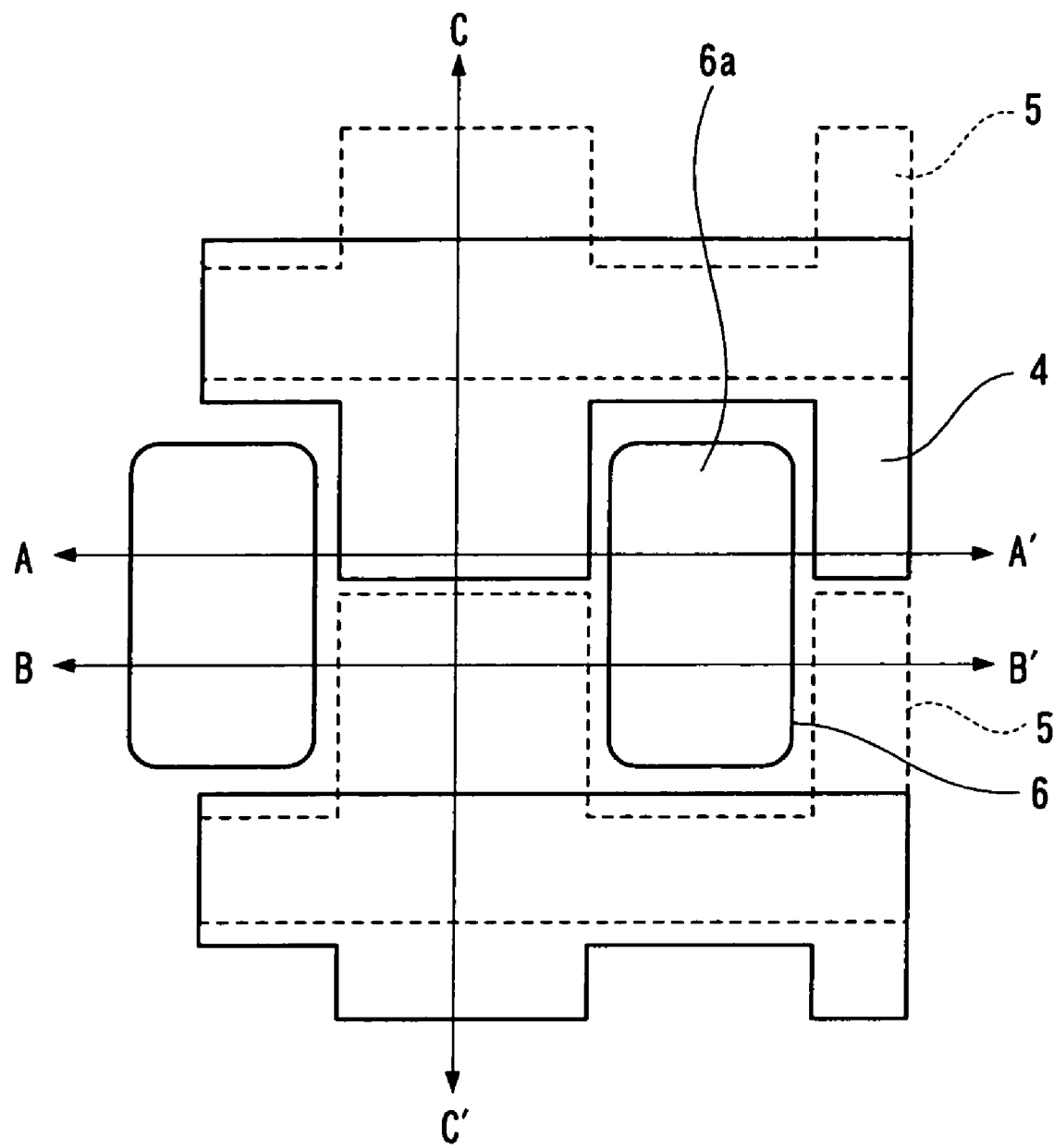
FIG. 1 is a plan view of principal components of the structure of a solid image pickup apparatus according to Embodiment 1 of the present invention.
Figure 2A:
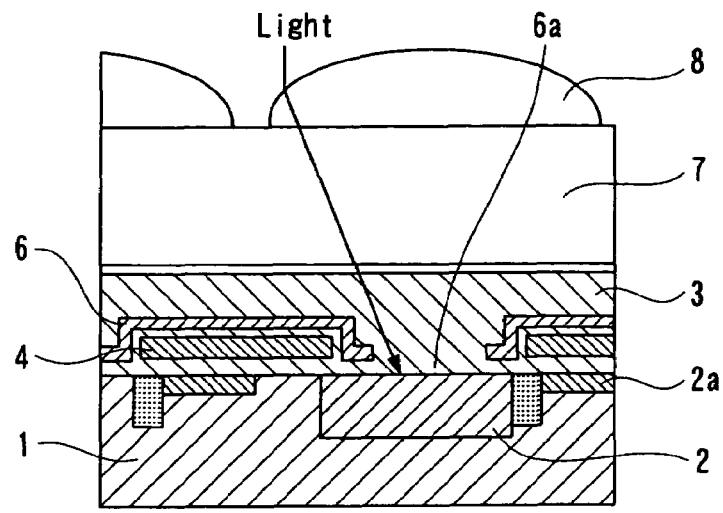
FIGS. 2A and B are cross-sectional views showing the structure of the solid image pickup apparatus according to Embodiment 1 of the present invention.
Figure 2B:
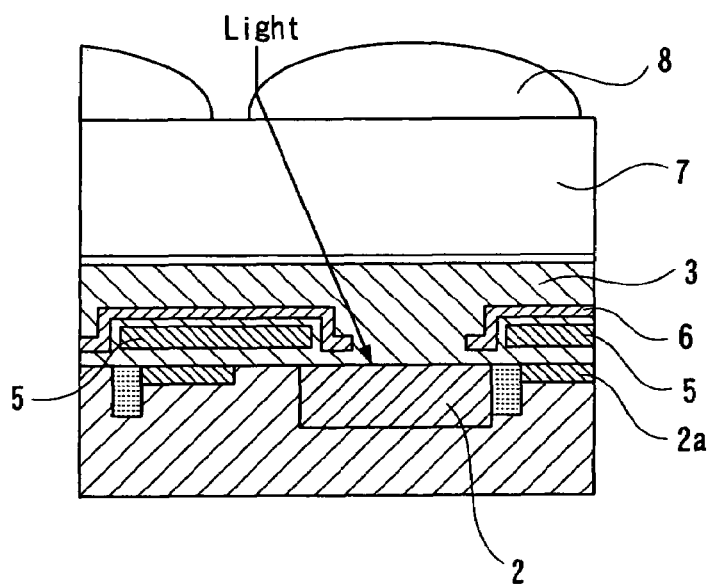
FIG. 2C is a cross-sectional view of principal components showing the structure of the solid image pickup apparatus according to Embodiment 1 of the present invention.
Figure 2C:
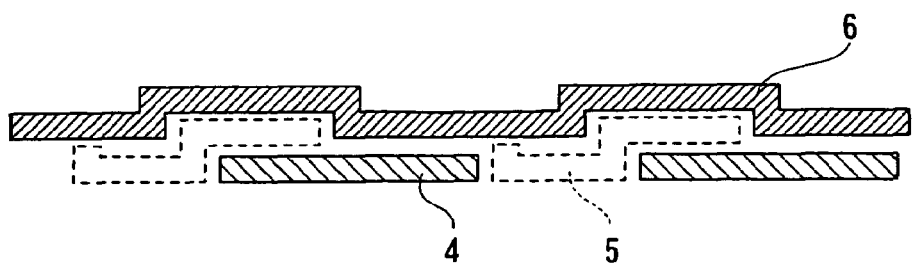

FIG. 1 is a plan view of principal components of the structure of the solid image pickup apparatus according to Embodiment 1. FIG. 2 is a cross-sectional view of the structure of the solid image pickup apparatus according to Embodiment 1; FIG. 2A is an A-A' cross-sectional view of FIG. 1, FIG. 2B is a B-B' cross-sectional view and FIG. 2C is a C-C' cross-sectional view of principal components of FIG. 1. In FIG. 1 and FIGS. 2A to 2C, reference numeral 1 denotes a semiconductor substrate, 2 denotes a light-receiving area diffused layer formed on the surface of the semiconductor substrate 1, 2a denotes a transfer area diffused layer formed adjacent to the light-receiving area diffused layer 2, 3 denotes an oxide insulating film formed over the entire surface of the semiconductor substrate 1 including the diffused layer 2, 4 denotes a first gate electrode, 5 denotes a second gate electrode, 6 denotes a light-shielding film, 7 denotes transparent resin (or color resin) and 8 denotes a lens.

Furthermore, in more specific explanations based on FIG. 1, FIGS. 2A to 2C, the light-receiving area diffused layer 2 is formed on the semiconductor substrate 1 in the form of an array and each transfer area diffused layer 2a is formed on the semiconductor substrate 1 adjacent to the light-receiving area diffused layer 2. An oxide film is formed on the semiconductor substrate 1 on which the light-receiving area diffused layer 2 and transfer area diffused layer 2a are formed. Each light-receiving area diffused layer 2 coated with the oxide film is surrounded by a plurality of first gate electrodes 4 and second gate electrodes 5. That is, a rectangular opening 6a is provided between one pair of gate electrodes 5, 4 and another pair of gate electrodes 5, 4 adjoining in the C-C' direction in the plan view of FIG. 1 and the one pair of gate electrodes 5, 4 do not overlap with the other pair of gate electrodes 5, 4. The transfer area is formed on the semiconductor substrate 1 in this non-overlapping area.

The light-receiving area diffused layer 2 is formed on the semiconductor substrate 1 below the opening 6a. The gate electrodes 5, 4 on the semiconductor substrate 1 except the opening 6a is coated with the light-shielding film 6 and the entire semiconductor substrate 1 including the opening 6a and light-shielding film 6 is coated with the oxide insulating film 3. The transparent resin 7 is arranged on the oxide insulating film 3. Furthermore, the lens 8 is provided on the transparent resin 7.

Figure 3A:
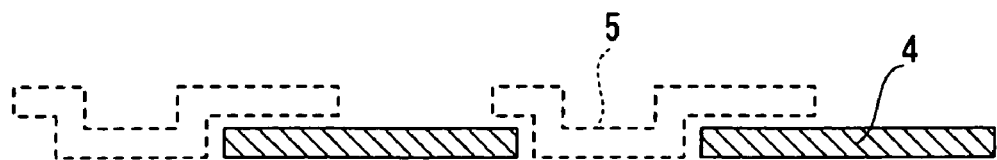
FIGS. 3A to 3D show manufacturing steps illustrating a method of manufacturing the solid image pickup apparatus according to Embodiment 1 of the present invention.
Figure 3B:
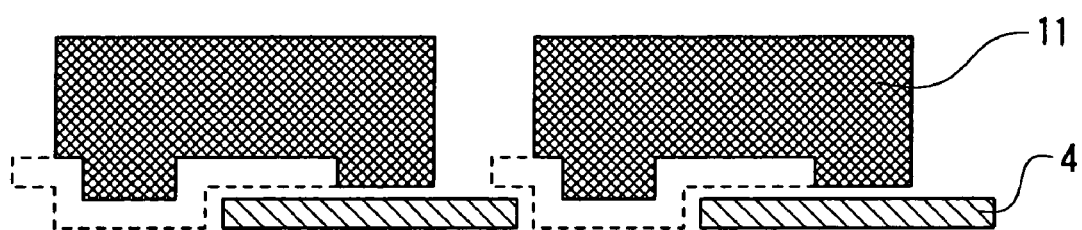

The method of manufacturing the solid image pickup apparatus having the above described structure will be explained below. FIGS. 3A to 3D are manufacturing steps showing the method of manufacturing the solid image pickup apparatus of this Embodiment 1 and shown using C-C' cross-sectional views of principal components in FIG. 1 in the respective steps. As shown in the step of FIG. 3A of the solid image pickup apparatus of this Embodiment 1, the first gate electrode 4 and the second gate electrode 5 are formed electrically insulated from each other and so as to partially overlap with each other on the semiconductor substrate 1 (not shown) on which the oxide film is formed. After the first gate electrode 4 and the second gate electrode 5 are formed, a resist pattern 11 is formed so as to selectively leave open a portion of the overlap between the first gate electrode 4 and the second gate electrode 5 as shown in the step of FIG. 3B.

Figure 3C:
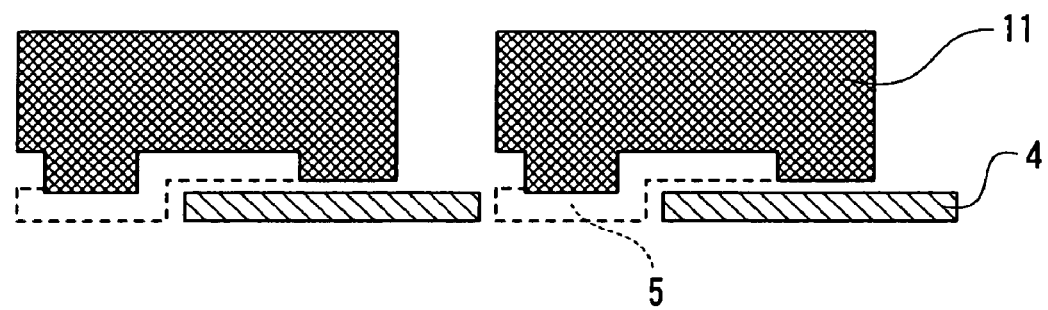
Figure 3D:
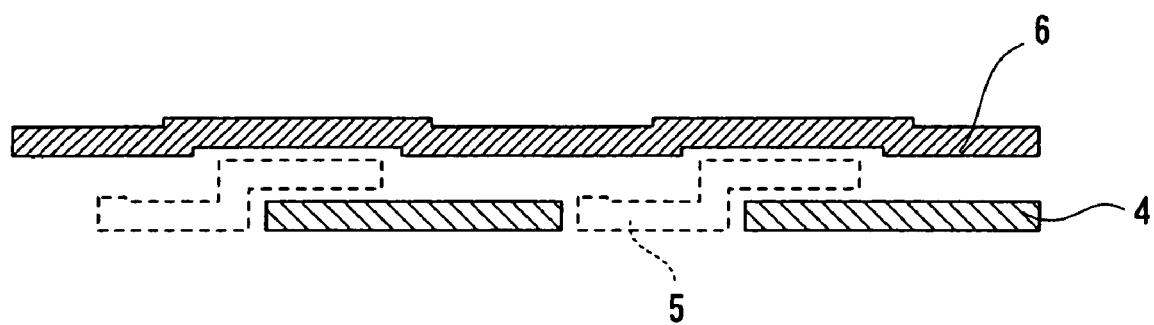

Next, as shown in the step of FIG. 3C, the portion including the overlap between the first gate electrode 4 and the second gate electrode 5 is removed through isotropic etching. A desired shape is obtained at this time by carrying out etching by an amount within a range of 140% to 200% of the film thickness of the second gate electrode 5. Next, as shown in the step of FIG. 3D, a normal inter-layer insulating film and the light-shielding film 6 are formed.

Advantages of the solid image pickup apparatus having the above described structure and according to the above described manufacturing method will be explained below. As shown in FIG. 1 and the A-A' cross-sectional view of FIG. 2A, by removing the overlap between the first gate electrode 4 and second gate electrode 5 and suppressing shading in the area adjacent to the opening 6a, it is possible to improve the light condensing rate by the lens 8. Especially when the aperture of the camera is open, a diagonal light component of the light incident upon the image pickup surface of the image pickup apparatus increases, and therefore the invention produces a noticeable effect. When the ratio of shading is compared with that of the conventional case, it is possible to secure a ratio of a light-shielding area corresponding to one gate electrode layer to a pixel of 40% or more for a 3 μm pitch pixel as opposed to approximately 20% in the conventional case.

By adopting the above described structure of the image pickup apparatus for the solid image pickup apparatus, it is possible to eliminate the overlap between the gate electrodes adjacent to the opening 6a of the light-shielding film 6, suppress the height of the light-shielding film 6 at that portion, reduce the shading for the light condensed by the lens 8 and thereby improve the light condensing efficiency of the lens 8.

As a result, it is possible to improve the sensitivity of a pixel by improving the light condensing efficiency of the lens 8 and realize an image pickup apparatus capable of obtaining a stable and high sensitivity pixel. This effect becomes noticeable in finer pixels in particular.

In Embodiment 1, all the portion of the second gate electrode 5 overlapping with the first gate electrode 4 in the opening 6a is removed, but only the portion adjacent to the opening 6a may be removed.

Furthermore, in Embodiment 1, it is also possible to allow polysilicon which becomes the second gate electrode 5 to grow after forming the first gate electrode 4, flatten this polysilicon through CMP, form the second gate electrode 5, and then form wiring for connecting the second gate electrode 5 on the first gate electrode 4.

At this time, the portion of the second gate electrode 5 overlapping with the first gate electrode 4 is preferably the portion corresponding to the principal light-receiving area of the transfer area.

Furthermore, in the step of removing part of the portion of the second gate electrode 5 overlapping with the first gate electrode 4, after forming the second gate electrode 5, it is preferable to leave open part of the portion of the second gate electrode 5 overlapping with the first gate electrode 4 and etch only the opening area.

Furthermore, the area of the opening is preferably smaller than the area of the portion of the second gate electrode 5 overlapping with the first gate electrode 4. That is, it is preferable to etch the second gate electrode 5 by narrowing the gap between the resist 11 and resist 11 in FIG. 3B so as to minimize the amount of shaving of the surface insulating film of the first gate electrode 4.

Furthermore, an inter-layer insulating film is preferably formed between the first gate electrode 4 and second gate electrode 5 in a step of forming the second gate electrode 5 on the semiconductor substrate 1 with the second gate electrode 5 electrically insulated from the first gate electrode 4.

Furthermore, the portion of the second gate electrode 5 overlapping with the first gate electrode 4 is preferably etched in such a way that a selection ratio between the inter-layer insulating film and the second gate electrode 5 is 1:100 or higher. That is, it is preferable to apply wet etching or dry etching at a ratio of 1:100 between the surface insulating film of the first gate electrode 4 and the second gate electrode 5.

According to these structure and method, it is possible to eliminate the overlap between the gate electrodes adjacent to the opening of the light-shielding film, suppress the height of the light-shielding film at that part, reduce shading of light condensed by the lens and thereby improve the light condensing efficiency of the lens.

Embodiment 2

A solid image pickup apparatus and a method of manufacturing the solid image pickup apparatus according to Embodiment 2 of the present invention will be explained.

Figure 4A:
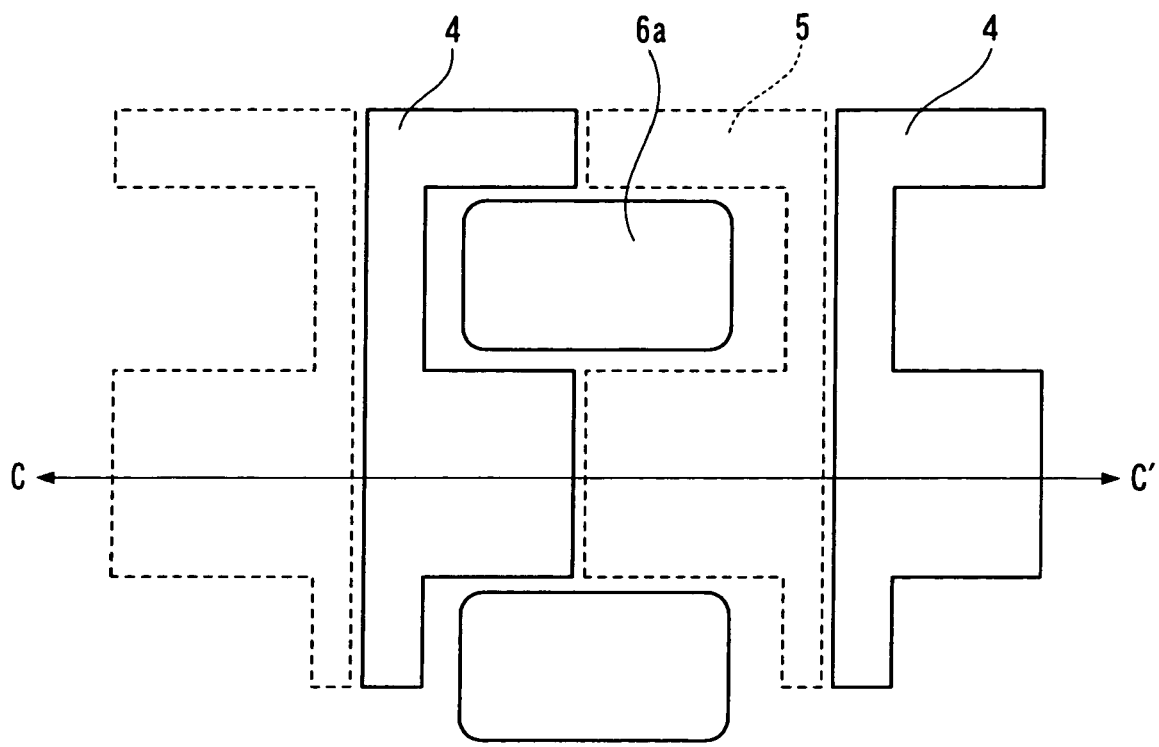
FIG. 4A is a plan view of principal components showing the structure of a solid image pickup apparatus according to Embodiment 2 of the present invention.
Figure 4B:
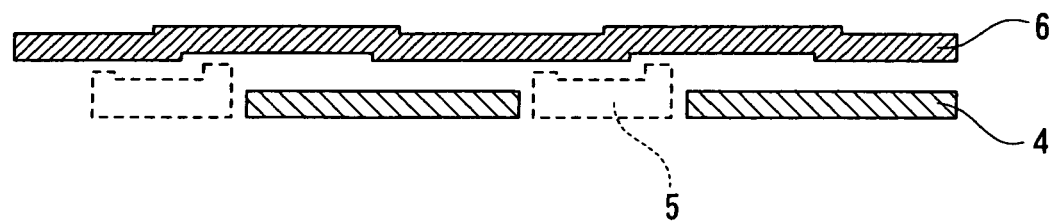
FIG. 4B is a C-C' cross-sectional view of FIG. 4A.

FIG. 4A is a plan view showing the structure of the solid image pickup apparatus according to Embodiment 2 and FIG. 4B is a C-C' cross-sectional view of principal components of FIG. 4A. Since the solid image pickup apparatus according to Embodiment 2 has substantially the same structure as that of Embodiment 1, the cross-sectional views such as FIG. 2A and FIG. 2B are omitted, but as in the case of FIG. 1 and FIG. 2A, the embodiment includes a light-receiving area diffused layer 2, a transfer area diffused layer 2a selectively formed on the surface of the semiconductor substrate 1, and an oxide insulating film 3 formed over the entire surface of the semiconductor substrate 1 including the diffused layer 2a, transparent resin (or color resin) 7 and a lens 8. What Embodiment 2 differs from Embodiment 1 is that the overlap between a first gate electrode 4 and a second gate electrode 5 is totally eliminated in Embodiment 2.

Furthermore, FIGS. 5A to 5D show manufacturing steps illustrating the method of manufacturing the solid image pickup apparatus according to Embodiment 2 and show C-C' cross-sectional views in FIG. 4A in the respective steps.

In the solid image pickup apparatus in this Embodiment 2, the first gate electrode 4 of a predetermined pattern is formed on a semiconductor substrate 1 and then an insulating film is formed over the entire surface of the substrate 1. Furthermore, a polysilicon film for the second gate electrode 5 is formed over the entire surface of the substrate 1 (not shown).

Figure 5A:
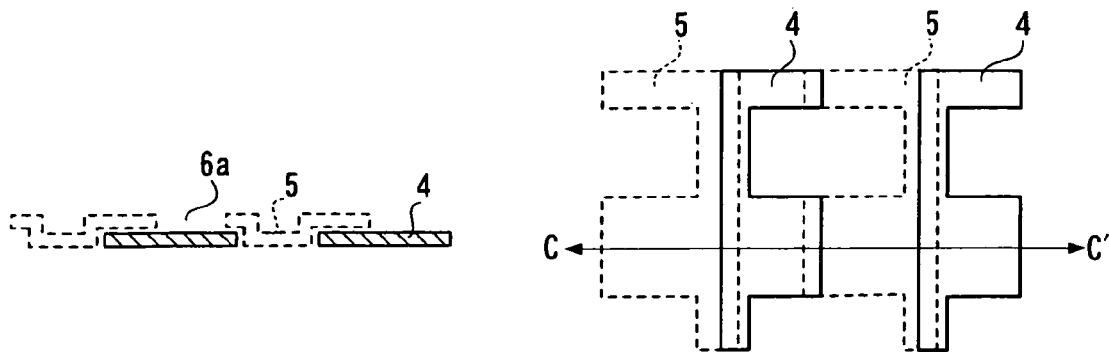
FIGS. 5A to 5D show manufacturing steps illustrating a method of manufacturing the solid image pickup apparatus according to Embodiment 2 of the present invention.

Furthermore, as shown in FIG. 5A, the film for the second gate electrode 5 is etched and the second gate electrode of a predetermined pattern is formed. However, the first gate electrode 4 and the second gate electrode 5 partially overlap with each other.

Figure 5B:
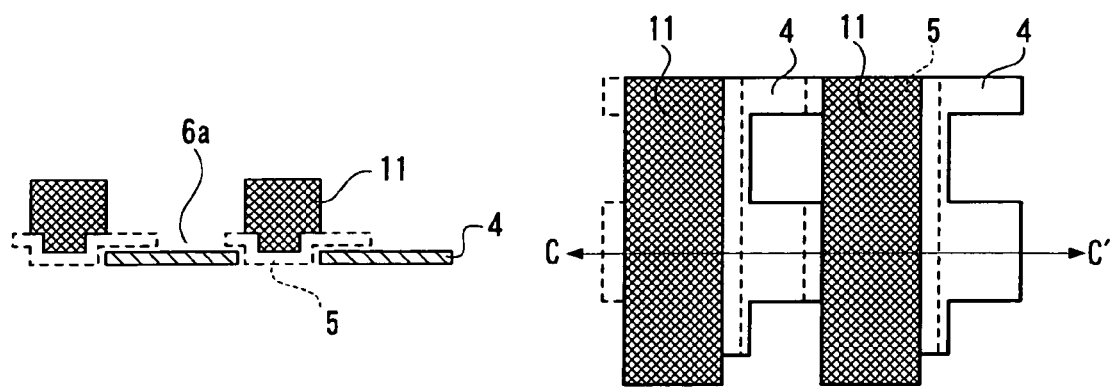

After forming the first gate electrode 4 and the second gate electrode 5 as described above, a resist pattern 11 is formed so as to selectively leave open the overlap between the first and second gate electrodes 4, 5 as shown in the step of FIG. 5B.

Figure 5C:
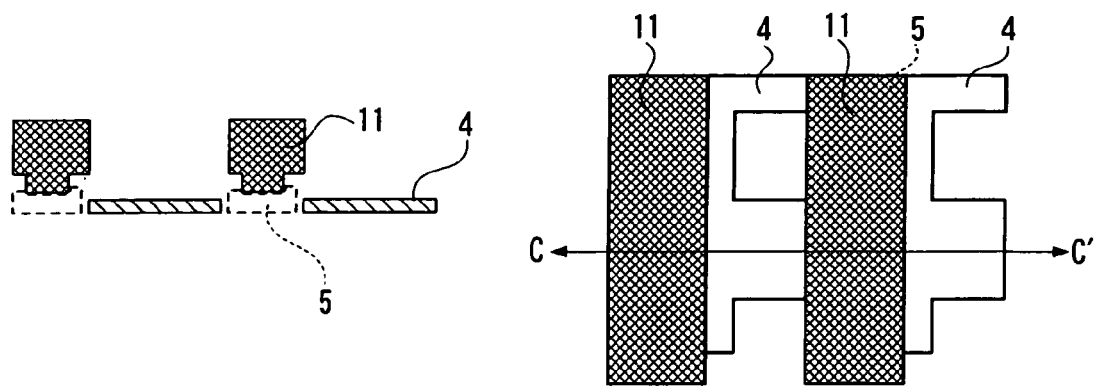
Figure 5D:
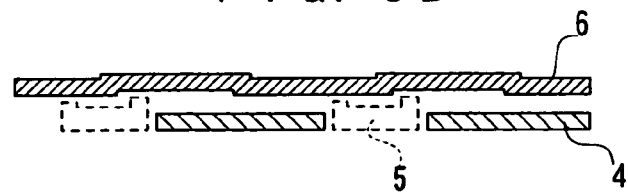

Next, as shown in the step of FIG. 5C, an area including the overlap between the first and second gate electrodes 4, 5 is removed through isotropic etching. A desired shape can be obtained by applying etching at this time by an amount within a range of 140% to 200% of the film thickness of the second gate electrode 5. Next, as shown in the step of FIG. 5D, a normal inter-layer insulating film and light-shielding film 6 are formed.

Advantages of the solid image pickup apparatus having the above described structure and according to the above described manufacturing method will be explained below. As shown in the A-A' cross-sectional view of FIG. 2A, given the ability to suppress shading in the area adjacent to the opening 6a, it is possible to improve the light condensing rate by the lens 8. Especially when the aperture on the camera side is open, a diagonal light component of light incident upon the image pickup surface of the image pickup apparatus increases, and therefore a noticeable effect is obtained. When the ratio of shading is compared with that of the conventional case, it is possible to secure a ratio of a light-shielding area corresponding to one gate electrode layer to a pixel 40% or more for a 3 μm pitch pixel as opposed to approximately 20% in the conventional case.

By constructing the above described solid image pickup apparatus as the image pickup apparatus, it is possible to completely eliminate the overlap between the gate electrodes adjacent to the opening 6a of the light-shielding film 6, suppress the height of the light-shielding film 6 at that portion, reduce shading for the light condensed by the lens 8 and thereby improve the light condensing efficiency of the lens 8.

As a result, it is possible to improve the light condensing efficiency of the lens 8, improve pixel sensitivity and realize an image pickup apparatus capable of obtaining stable and high sensitivity pixels. This effect is noticeable in finer pixels in particular.

At this time, in the step of removing the portion of the second gate electrode 5 overlapping with the first gate electrode 4, it is preferable to leave open part of the portion of the second gate electrode 5 overlapping with the first gate electrode 4 and etch only the opening area.

Furthermore, the area of the opening is preferably smaller than the area of the portion of the second gate electrode 5 overlapping with the first gate electrode 4. That is, it is preferable to etch the second gate electrode 5 by narrowing the gap between the resist 11 and resist 11 in FIG. 5B so as to minimize the amount of shaving of the surface insulating film of the first gate electrode 4.

Furthermore, an inter-layer insulating film is preferably formed between the first gate electrode 4 and second gate electrode 5 in the step of forming the second gate electrode on the semiconductor substrate 1 with the second gate electrode 5 electrically insulated from the first gate electrode 4.

Furthermore, the portion of the second gate electrode 5 overlapping with the first gate electrode 4 is preferably etched in such a way that a selection ratio between the inter-layer insulating film and the second gate electrode 5 is 1:100 or higher. That is, it is preferable to apply wet etching or dry etching at a ratio of 1:100 between the surface insulating film of the first gate electrode 4 and the second gate electrode 5.

Embodiment 3

A solid image pickup apparatus and a method of manufacturing the solid image pickup apparatus according to Embodiment 3 of the present invention will be explained.

Figure 6A:
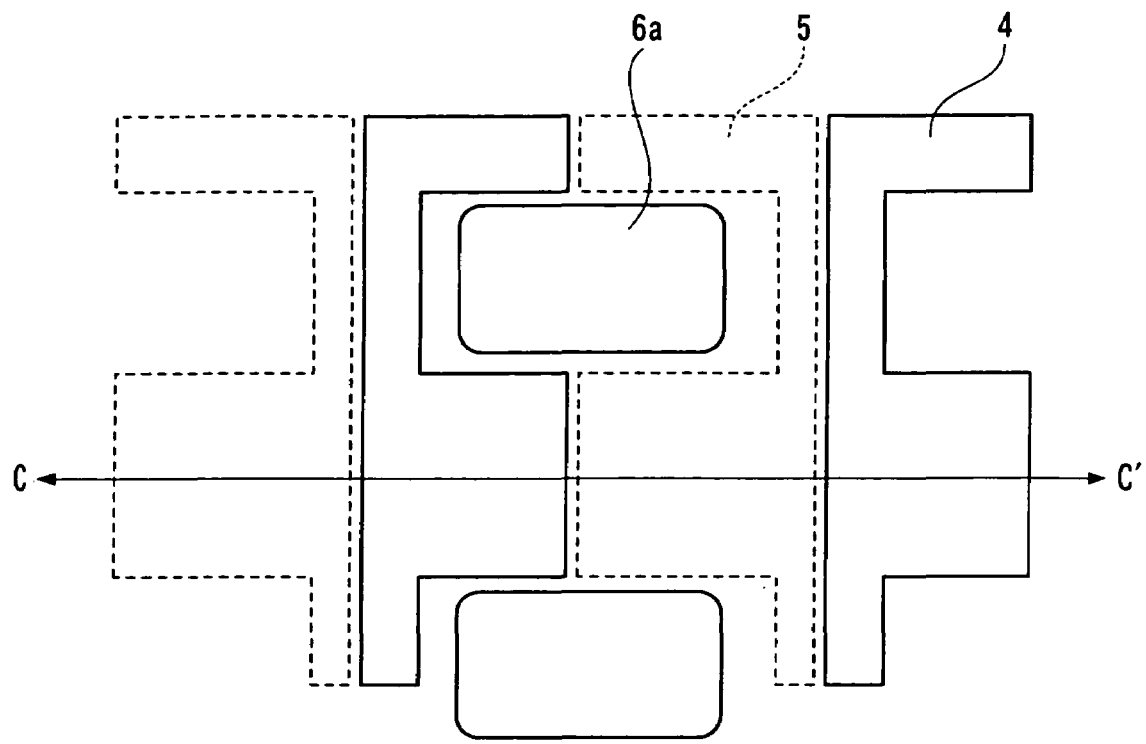
FIG. 6A is a plan view of principal components showing the structure of a solid image pickup apparatus according to Embodiment 3 of the present invention.
Figure 6B:
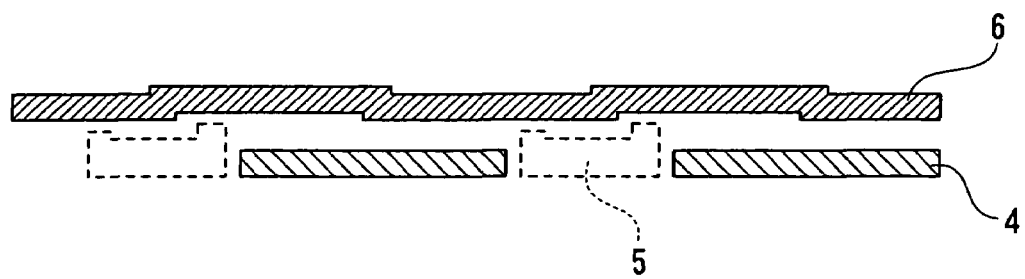
FIG. 6B is a C-C' cross-sectional view of FIG. 6A.

FIG. 6A is a plan view of principal components showing the structure of the solid image pickup apparatus according to Embodiment 3 and FIG. 6B is a C-C' cross-sectional view of FIG. 6A. Since the solid image pickup apparatus according to Embodiment 3 also has substantially the same structure as that of Embodiment 1, the cross-sectional views such as FIG. 2A and FIG. 2B are omitted, but as in the case of FIG. 1 and FIG. 2A, this embodiment includes a light-receiving area diffused layer 2 and a transfer area diffused layer 2a selectively formed on the surface of the semiconductor substrate 1, an oxide insulating film 3 formed over the entire surface of the semiconductor substrate 1 including the diffused layer 2, transparent resin (or color resin) 7 and a lens 8.

Furthermore, FIGS. 7A to 7D show manufacturing steps illustrating a method of manufacturing the solid image pickup apparatus according to Embodiment 3 and show C-C' cross-sectional views and a plan view in FIG. 6A in the respective steps.

Figure 7A:
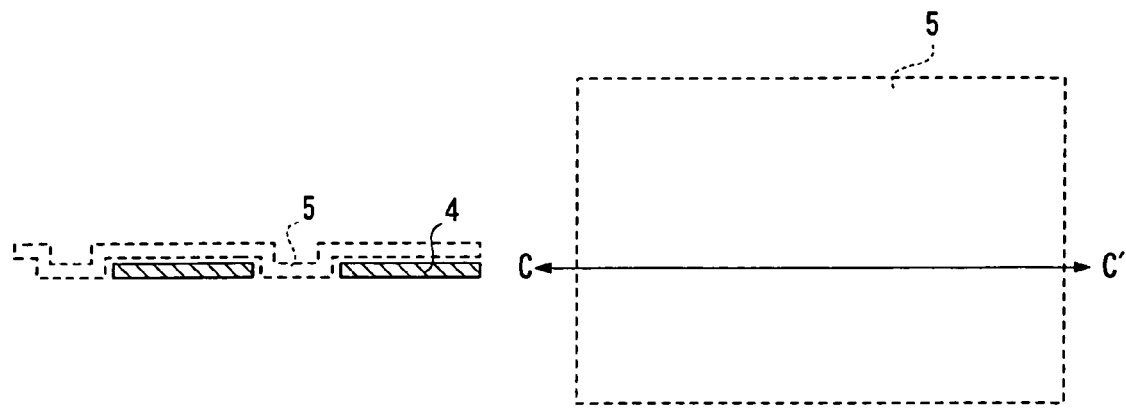
FIGS. 7A to 7D show manufacturing steps illustrating a method of manufacturing the solid image pickup apparatus according to Embodiment 3 of the present invention.

In the solid image pickup apparatus according to this Embodiment 3, a first gate electrode 4 of a predetermined pattern is formed on a semiconductor substrate 1. Furthermore, after an insulating film is formed over the entire surface of the substrate 1 as shown in FIG. 7A, a polysilicon film for the second gate electrode 5 is formed over the entire surface of this insulating film.

Figure 7B:
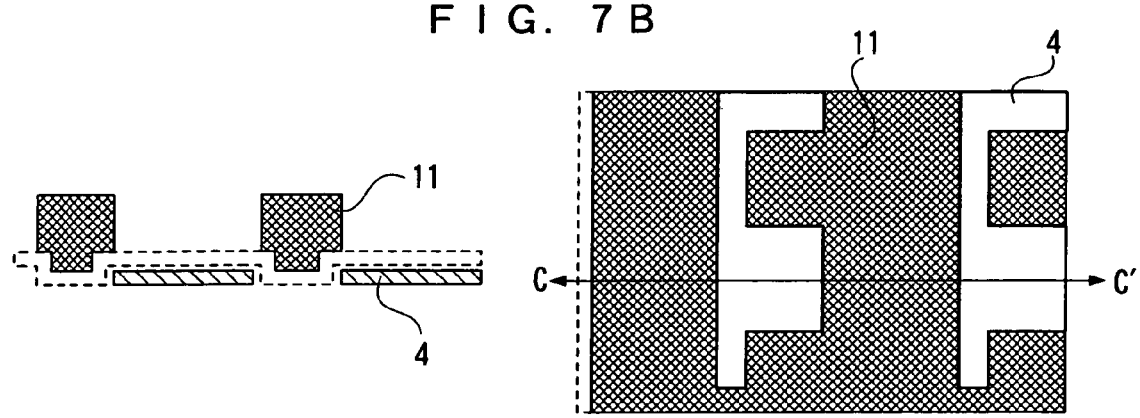

Next, as shown in the step of FIG. 7B, a resist pattern 11 is formed so as to selectively leave open the overlap between the first and second gate electrodes 4, 5. That is, the portion corresponding to the first gate electrode 4 is left open and the resist pattern 11 is formed on the second gate electrode 5.

Figure 7C:
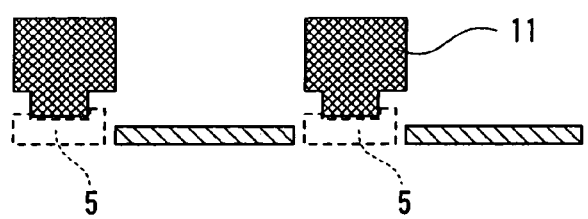

Next, as shown in the step of FIG. 7C, an area including the overlap between the gate electrodes 4, 5 is removed through isotropic etching. A desired shape can be obtained at this time by carrying out etching by an amount within a range of 140% to 200% of the film thickness of the second gate electrode 5.

Figure 7D:
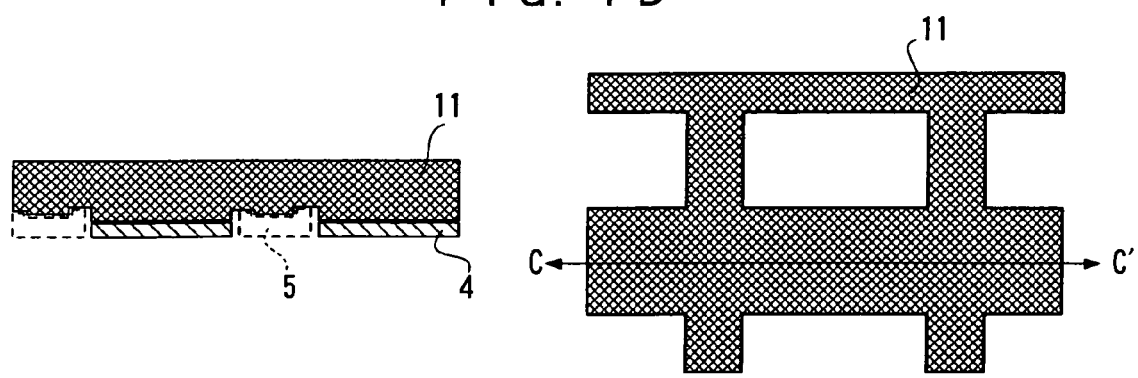

Next, as shown in FIG. 7D, the surfaces of the first gate electrode 4 and the second gate electrode 5 are masked with the resist pattern 11 and subjected to etching. After the second gate electrode 5 is formed in this way, a normal inter-layer insulating film and light-shielding film 6 are formed as shown in FIG. 6B.

Advantages of the solid image pickup apparatus having the above described structure and according to the above described manufacturing method will be explained below. As shown in the A-A' cross-sectional view of FIG. 2A, with the ability to suppress shading in the area adjacent to the opening 6a, it is possible to improve the light condensing rate by the lens 8. Especially when the aperture on the camera side is open, a diagonal light component of the light incident upon the image pickup surface of the image pickup apparatus increases, and therefore a noticeable effect is obtained. When the ratio of shading is compared with the conventional case, it is possible to secure a ratio of a light-shielding area corresponding to one gate electrode layer to a pixel of 40% or more for a 3 μm pitch pixel as opposed to approximately 20% in the conventional case.

By constructing the above described solid image pickup apparatus as the image pickup apparatus, it is possible to eliminate the overlap between the gate electrodes adjacent to the opening 6a of the light-shielding film 6, suppress the height of the light-shielding film 6 at that portion, reduce the shading for the light condensed by the lens 8 and thereby improve the light condensing efficiency of the lens 8.

As a result, it is possible to improve the light condensing efficiency of the lens 8, improve pixel sensitivity and realize an image pickup apparatus capable of obtaining stable and high sensitivity pixels. This effect is noticeable in finer pixels in particular.

At this time, the area of the opening is preferably smaller than the area of the portion of the second gate electrode 5 overlapping with the first gate electrode 4.

Furthermore, an inter-layer insulating film is preferably formed between the first gate electrode 4 and the second gate electrode 5 in the step of forming the second gate electrode 5 on the semiconductor substrate 1 with the second gate electrode 5 electrically insulated from the first gate electrode 4.

Furthermore, the portion of the second gate electrode 5 overlapping with the first gate electrode 4 is preferably etched in such a way that a selection ratio between the inter-layer insulating film and the second gate electrode 5 is 1:100 or higher.

Embodiment 4

A solid image pickup apparatus and a method of manufacturing the solid image pickup apparatus according to Embodiment 4 of the present invention will be explained.

Figure 8A:
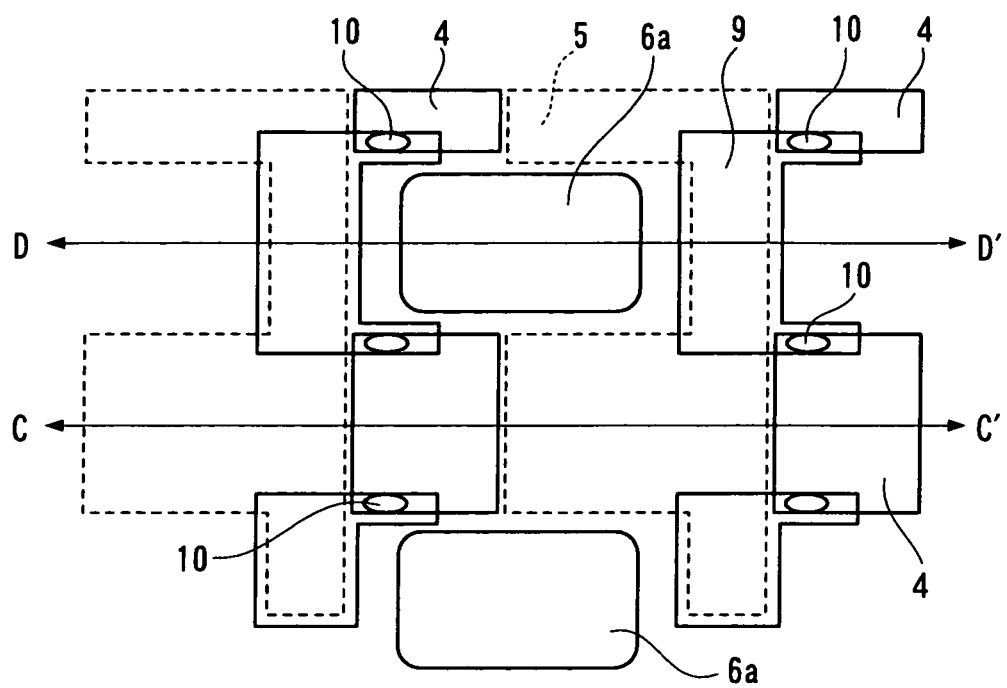
FIG. 8A is a plan view showing the structure of a solid image pickup apparatus according to Embodiment 4 of the present invention.
Figure 8B:
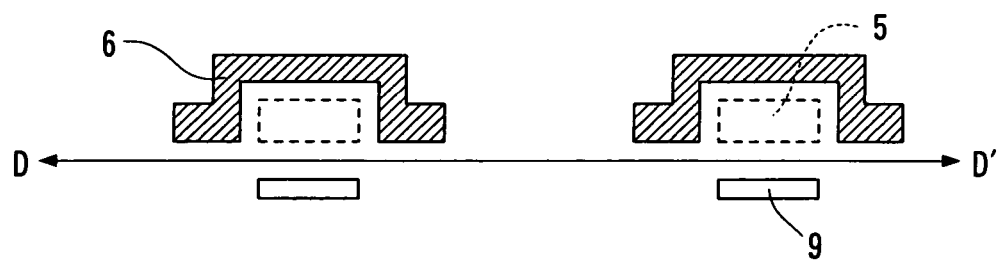
FIG. 8B is a D-D' cross-sectional view of FIG. 8A.
Figure 8C:
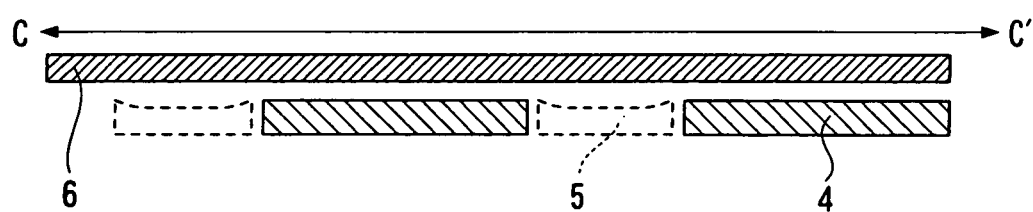
FIG. 8C is a C-C cross-sectional view of FIG. 8A.
Figure 10:
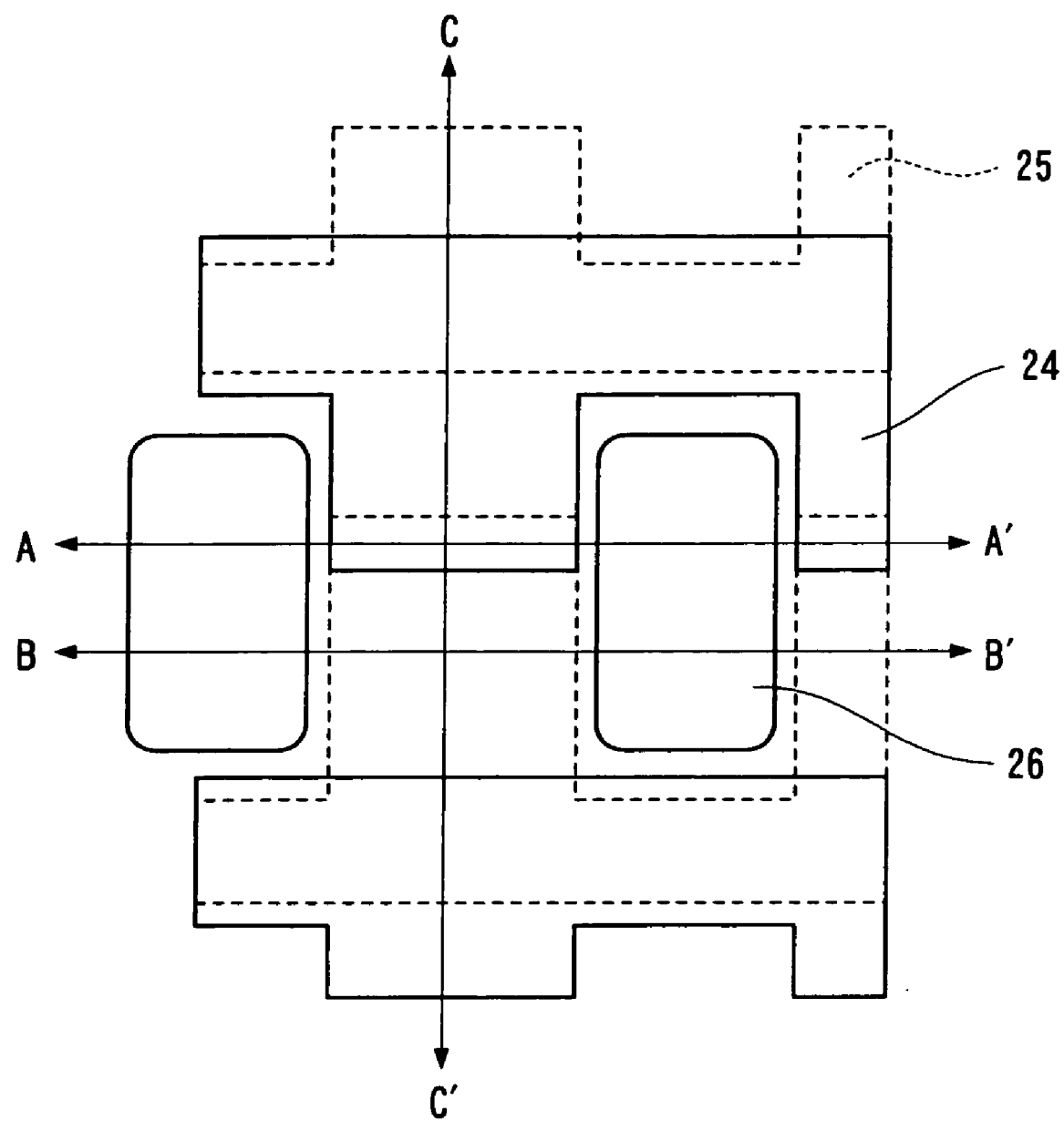
FIG. 10 is a plan view showing the structure of a conventional solid image pickup apparatus.
Figure 11A:
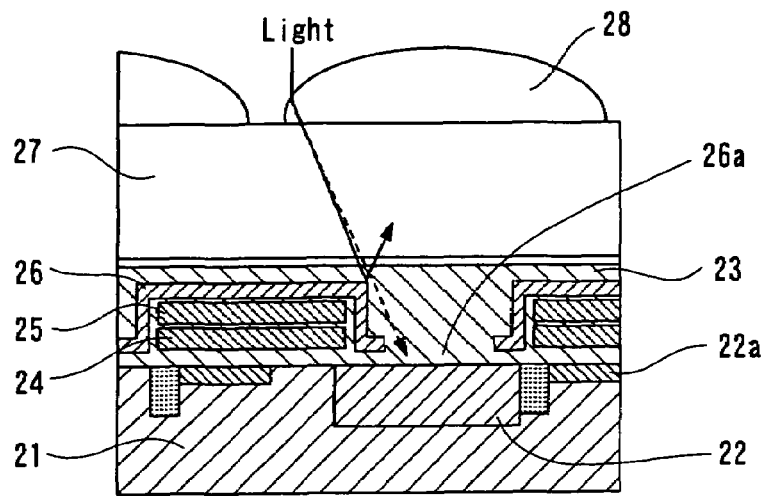
FIGS. 11A to 11C are cross-sectional views showing the structure of the solid image pickup apparatus.
Figure 11B:
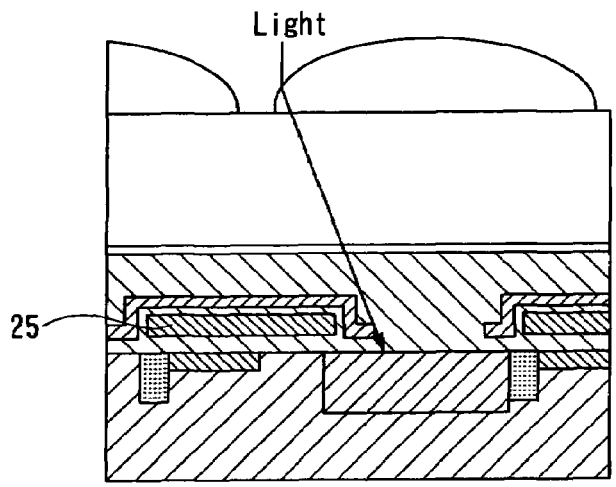
Figure 11C:
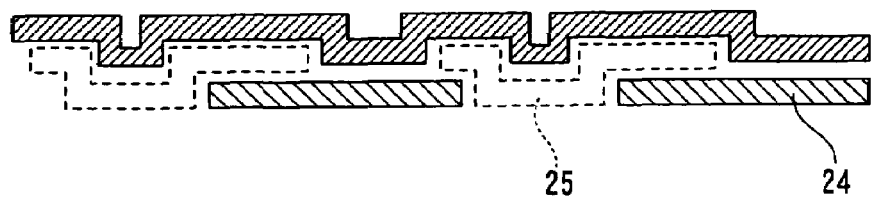

FIG. 8A is a plan view showing the structure of the solid image pickup apparatus according to Embodiment 4, FIG. 8B is a D-D' cross-sectional view of principal components of FIG. 8A and FIG. 8C is a C-C' cross-sectional view of principal components of FIG. 8A. Since the structure is similar to the conventional structure, some parts are omitted in FIG. 8, but as in the case of FIG. 1 and FIG. 2, this embodiment includes a light-receiving area diffused layer 2 and a transfer area diffused layer 2a selectively formed on the surface of the semiconductor substrate 1, an oxide insulating film 3 formed over the entire surface of the semiconductor substrate 1 including the diffused layer 2, transparent resin (or color resin) 7 and a lens 8.

What is different from FIG. 1 will be explained below. In FIGS. 8A to 8C, reference numeral 9 denotes an embedded gate electrode embedded in a semiconductor substrate 1, 10 denotes a contact hole for electrically connecting a first gate electrode 4 formed on the embedded gate electrode 9 and the oxide insulating film 3 (not shown), 5 denotes a second gate electrode and 6 denotes a light-shielding film.

The method of manufacturing the solid image pickup apparatus having the above described structure will be explained below.

FIGS. 9A to 9C show manufacturing steps in the method of manufacturing the solid image pickup apparatus according to this Embodiment 4 and show the C-C' cross-sectional views in FIG. 8A in the respective steps.

In the solid image pickup apparatus in this Embodiment 4, as shown in the plan view of principal components of FIG. 8A, D-D' cross-sectional view of FIG. 8B and C-C' cross-sectional view of FIG. 8C, the diffused layer 2 (not shown) is selectively formed in the semiconductor substrate 1 first, then the embedded gate electrode 9 is formed and the oxide insulating film 3 (not shown) is further formed. Then, the contact holes 10 are formed in the gate electrode 9 and oxide insulating film 3.

Next, as shown in the step of FIG. 9A, the first gate electrode 4 is formed. When the first gate electrode 4 is formed, the first gate electrode 4 and embedded gate electrode 9 are electrically connected through polysilicon charged into the contact holes via the contact holes 10. After the first gate electrode 4 is formed on the semiconductor substrate 1, the polysilicon is allowed to grow. As shown in the step of FIG. 9B, the polysilicon is flattened through CMP, the second gate electrode 5 is formed of the polysilicon and then a normal light-shielding film 6 is formed as shown in the step of FIG. 9C. Furthermore, though not shown, the transparent resin (or color resin) and the lens are formed.

Advantages of the solid image pickup apparatus having the above described structure and according to the above described manufacturing method will be explained below. As shown in the D-D' cross-sectional view of FIG. 8B and C-C' cross-sectional view of FIG. 8C, by eliminating all the overlap between the gate electrodes 4, 5 adjacent to the opening 6a, it is possible to suppress the height of the light-shielding film 6 and suppress the height of the portion (D-D' cross section) to which two-dimensionally arrayed gate electrodes are connected, and therefore it is possible to expand the opening 6a not only in the Y-direction of FIG. 8A but also in the X-direction and thereby further improve the light condensing efficiency of the lens.

By constructing the above described solid image pickup apparatus as the image pickup apparatus, it is possible to eliminate the overlap between the gate electrodes adjacent to the opening 6a of the light-shielding film 6, suppress the height of the light-shielding film 6 at that portion, reduce the shading for the light condensed by the lens and thereby improve the light condensing efficiency of the lens.

As a result, it is possible to improve the light condensing efficiency of the lens, improve pixel sensitivity and realize an image pickup apparatus capable of obtaining stable and high sensitivity pixels. This effect is noticeable in finer pixels in particular.

INDUSTRIAL APPLICABILITY

As explained above, the present invention eliminates the overlap between the gate electrodes adjacent to the opening of the light-shielding film, suppress the height of the light-shielding film at that portion, reduce shading for the light condensed by the lens and thereby improve the light condensing efficiency of the lens.

As a result, also in the case of finer pixels, it is possible to improve the light condensing efficiency of the lens, improve pixel sensitivity and realize an image pickup apparatus capable of obtaining stable and high sensitivity pixels.

What is claimed is:

1. A method of manufacturing a photoelectric solid image pickup apparatus, said method comprising:
    forming a semiconductor substrate comprising a plurality of light-receiving areas and at least one transfer area;
    forming an insulating film on said semiconductor substrate;
    forming a first electrode on said insulating film;
    forming a second electrode on said semiconductor substrate, the second electrode overlapping but being electrically insulated from the first electrode; and
    removing all the portion of the second electrode overlapping the first electrode.

2. The method of manufacturing a photoelectric solid image pickup apparatus according to claim 1, wherein when the portion of the second electrode overlapping the first electrode is removed, a first portion of the second electrode overlapping the first electrode is removed using a first resist pattern with a first opening over the second electrode, then a second portion of the second electrode is removed using a second resist pattern with a second opening over the second electrode.

3. The method of manufacturing a photoelectric solid image pickup apparatus according to claim 1, wherein the portion of the second electrode overlapping the first electrode is removed by isotropic etching.

4. The method of manufacturing a photoelectric solid image pickup apparatus according to claim 1, wherein when the second electrode is formed on said semiconductor substrate, an inter-layer insulating film is formed between the first electrode and the second electrode.

5. The method of manufacturing a photoelectric solid image pickup apparatus according to claim 4, wherein in removing the second electrode, the selection ratio between the inter-layer insulating film and the second electrode is 1:100 or higher.

6. The method of manufacturing a photoelectric solid image pickup apparatus according to claim 2, wherein the first opening of the first resist pattern is located over the light receiving area and the second opening of the second resist pattern is located over the portion of the second electrode overlapping the first electrode.

7. The method of manufacturing a photoelectric solid image pickup apparatus according to claim 2, wherein the first opening of the first resist pattern is located over the portion of the second electrode overlapping the first electrode and the second opening of the second resist pattern is located over the light receiving area.

8. The method of manufacturing a photoelectric solid image pickup apparatus according to claim 2, wherein the first removed portion of the second electrode is larger than the first opening.

9. The method of manufacturing a photoelectric solid image pickup apparatus according to claim 2, wherein the second removed portion of the second electrode is larger than the first opening.

10. The method of manufacturing a photoelectric solid image pickup apparatus according to claim 1, further comprising forming a normal inter-layer insulating film on the first electrode, the second electrode, and the light-receiving area.

11. The method of manufacturing a photoelectric solid image pickup apparatus according to claim 10, further comprising forming a light-shielding film on the normal inter-layer insulating film over the first and second electrodes.

12. The method of manufacturing a photoelectric solid image pickup apparatus according to claim 11, further comprising forming a transparent resin on the light-shielding film.

13. The method of manufacturing a photoelectric solid image pickup apparatus according to claim 11, further comprising forming a color resin on the light-shielding film.

14. The method of manufacturing a photoelectric solid image pickup apparatus according to claim 1, further comprising forming a lens on the semiconductor substrate.

* * * * *